United States Patent [19]

Bowman et al.

[11] Patent Number: 5,557,199
[45] Date of Patent: Sep. 17, 1996

[54] MAGNETIC RESONANCE MONITOR

[75] Inventors: Joseph D. Bowman, Cincinnati; Daniel P. Engel, III, Cheviot, both of Ohio

[73] Assignee: The United States of America as represented by the Department of Health and Human Services, Washington, D.C.

[21] Appl. No.: 235,833

[22] Filed: Apr. 29, 1994

[51] Int. Cl.$^6$ .................................................. G01V 3/00
[52] U.S. Cl. ........................................ 324/301; 324/322
[58] Field of Search ................................. 324/300, 301, 324/306, 307, 309, 318, 322, 244, 248; 128/653.5

[56] References Cited

U.S. PATENT DOCUMENTS

| | | | |
|---|---|---|---|
| 4,591,788 | 5/1986 | Mohri et al. | 324/260 |
| 4,771,239 | 9/1988 | Hoenig | 324/248 |
| 4,791,368 | 12/1988 | Tsuzuki | 324/301 |
| 4,793,355 | 12/1988 | Crum et al. | 128/653 |
| 4,801,882 | 1/1989 | Daalmans | 324/248 |
| 4,827,217 | 5/1989 | Paulson | 324/248 |
| 4,864,238 | 9/1989 | Seitz | 324/253 |
| 4,931,152 | 6/1990 | Naik et al. | 204/38.5 |
| 4,951,674 | 8/1990 | Zanakis et al. | 128/653 R |
| 4,977,896 | 12/1990 | Robinson et al. | 128/653 R |
| 4,994,739 | 2/1991 | Honda et al. | 324/207.14 |
| 4,994,742 | 2/1991 | Lowther | 324/251 |
| 5,015,953 | 5/1991 | Ferguson et al. | 324/244 |
| 5,018,724 | 5/1991 | Naser et al. | 272/73 |
| 5,020,538 | 6/1991 | Morgan et al. | 128/653 R |
| 5,027,819 | 7/1991 | Crum | 128/653 |
| 5,136,242 | 8/1992 | Abraham-Fuchs | 324/301 |
| 5,198,766 | 3/1993 | Spraul et al. | 324/300 |

OTHER PUBLICATIONS

Bartington Instruments Ltd. (1993): Operation/Service Manual for the MAG–03MC Three Axis Magnetic Field Sensor and MAG–03MC Power Supply Unit. Oxon, England. Mo. of Pub. unknown.

Bierbaum P J, Peters J M (1991): Proceedings of the Scientific Workshop on the Health Effects of Electric and Magnetic Fields on Workers. DHHS (NIOSH) Publication No. 91–111. Cincinnati, OH: National Institute for Occupational Safety and Health. Mo. of Pub. unknown.

Blackman C F (1990): ELF effects on calcium homeostasis. In Wilson B W, Stevens R G, Anderson L E, (eds.): Extremely Low Frequency Electromagnetic Fields: The Question of Cancer. Columbus, OH: Battelle, pp. 187–208. Mo of Pub. unknown.

Bowman J D, Sobel E, London S J, Thomas D C, Garabrant D H, Pearce N, Peters J M (1992): Electric and Magnetic Field Exposure, Chemical Exposure, and Leukemia Risk in "Electrical" Occupations. EPRI Report TR–101723. Palo Alto, CA: Electric Power Research Institute. Mo. of Pub. unknown.

(List continued on next page.)

Primary Examiner—Louis M. Arana
Attorney, Agent, or Firm—Lowe, Price, LeBlanc & Becker

[57] ABSTRACT

A magnetic resonance monitor measures static and extremely low frequency magnetic fields in order to determine the degree of magnetic resonance with the magnetic moments of a biological substrate, more particularly resonance with the magnetic moments of a human body. A digital bandpass filter varies in response to the magnitude of the static magnetic field so that it selects frequencies of the oscillating magnetic field in accordance with the gyromagnetic equation. A spatial analyzer determines the three spatial components of the filtered signals representing the magnetic field oscillating parallel to the static magnetic field vector and the two circularly-polarized components rotating perpendicular to the static field with helicities opposite to each other. A resonance analyzer evaluates accurately the resonance yield which is the change in biochemical processes due to magnetic field exposures. The magnetic resonance monitor can measure from magnetic fields in residential and workplace environments, either for research studies or for the routine evaluations of health hazards.

16 Claims, 7 Drawing Sheets

OTHER PUBLICATIONS

Condon E U, Shortley G H (1967): The Theory of Atomic Spectra. Cambridge: The University Press, pp. 378–380. Mo. of Pub. unknown.

Electric Research and Management, Inc. (1993): Multiwave™ System II User's Manual: Portable Magnetic Field Measurement Concept. State College, PA. Month of Publication unknown.

Grundler W, Kaiser F, Keilmann F, Walleczek J (1992): Mechanisms of electromagnetic interaction with cellular systems. Naturwissenschaft 79: 551–559. Month of Publication unknown.

Jacobs J A (1987): Geomagnetism, vol. 1. London: Academic Press, pp. 108–113. Month of Publication unknown.

Jackson J D (1962). Classical Electrodynamics. John Wiley and Sons, New York, pp. 205–207 and 231. Month of Publication unknown.

Jackson L B (1991): Signals, Systems, and Transforms. Addison–Wesley, Reading, MA. Month of Publication unknown.

Kirschvink J L (1992): Comment on "Constraints on biological effects of weak extremely low–frequency electromagnetic fields". Phys Rev A46:2178–2183 and 2185–2187. Month of Publication unknown.

Lednev V V (1991): Possible mechanism for influence of weak magnetic fields on biological systems. Bioelectromagnetics 12:71–75. Month of Publication unknown.

Liboff A R, McLeod B R (1988): Kinetics of channelized membrane ions in magnetic fields. Bioelectromagnetics 9:39–51. Month of Publication unknown.

Liboff A R, McLeod B R, Smith S D (1990): Electromagnetic fields, cell membrane amplification, and cancer promotion. In Wilson B W, Stevens R G, Anderson L E, (eds.): Extremely Low Frequency Electrmagnetic Fields: The Question of Cancer. Columbus, Ohio: Battelle, pp. 251–289. Month of Publication unknown.

London S J, Thomas D C, Bowman J D, Sobel E, Cheng T C, Peters J M, (1991): Exposure to residential electric and magnetic fields and risk of childhood leukemia. Am J Epidemiol 134:923–937. Month of Publication unknown.

Happer W, Gupta R (1978): Perturbed fluorescence. In: Hanle W, Kleinpoppen H (eds), "Progress in Atomic Spectroscopy." New York: Plenum, pp. 391–401; 410–425; and 460–463. Month of Publication unknown.

Macomber J D (1976): The Dynamics of Spectroscopic Transistions: Illustrated by Magnetic Resonance and Laser Effects. New York: John Wiley and Sons. Month of Publication unknown.

McLaughlin K (1992): Are environmental magnetic fields dangerous? Phys World, Jan. 1992. Month of Publication unknown.

Popović R S (1991): Hall Effect Devices: Magnetic Sensors and Characterization of Semiconductors. Institute of Physics, United Kingdom. Month of Publication unknown.

Steiner U E, Ulrich T (1989): Magnetic field effects in chemical kinetics and related phenomena. Chem Rev 89:51–147. Month of Publication unknown.

MAGNETIC RESONANCE MONITOR

TECHNICAL FIELD

This invention relates to measurement instruments for magnetic fields, and more particularly to instruments for measuring combined static and extremely low frequency magnetic fields in the environment. Still more specifically, the invention relates to instruments for measurement of environmental magnetic fields which are in magnetic resonance with magnetic moments in a biological organism, particularly the human body.

BACKGROUND ART

Research has recently been undertaken on the possibility that magnetic fields may cause cancer, reproductive abnormalities, or psychoneurological disorders [Bierbaum and Peters, 1991]. Research emphasis is being placed on possible effects of magnetic fields produced by AC electric power transmission facilities and electric appliances, although other sources may be involved. In order to carry out such research more effectively and accurately, there is a requirement for instrumentation for measuring magnetic fields with frequencies below 3000 Hz. Moreover, it is necessary to make such measurements in workplaces, homes and other environments so that compact, transportable, instruments are required.

Although many instruments are available for measuring magnetic fields in the environment, such instruments do not distinguish between those magnetic fields which may interact with a biological organism and those which may not. Thus, in order to obtain meaningful research results, it is necessary to be able to identify and measure magnetic fields which may have biological effects on the human body.

To explain the biological effects of interest, it has been proposed that ions important to cell functioning may experience "cyclotron resonance" [Liboff et al., 1990] or "parametric resonance" [Lednev, 1991]. Other forms of magnetic resonance with the magnetic fields in the environment are being investigated for potential chemical effects produced thereby [Grundler, et al., 1992]. For example, electron spin resonance is known to enhance the production of "free radical" molecules [Steiner and Ulrich, 1989; McLaughlin, 1992], and magnetic field interactions with magnetosomes (biological magnetic crystals) are being studied [Kirschvink, 1992].

The magnetic field combinations that cause nuclear magnetic resonance and electron spin resonance are well known [Macomber, 1976], and laboratory studies now suggest that magnetic resonance principles may apply to magnetic moments from electron spin, ferromagnetic crystals, or ionic motion in biological substrates. These hypotheses imply that biological processes can be affected by combinations of oscillating and static magnetic fields which are in resonance with magnetic moments in the human body.

In order to determine resonance conditions, it is necessary to measure both static and oscillating magnetic fields, and to provide output data more detailed than an average magnitude of either (or both) the static and oscillating fields. It is also necessary to identify the frequency components of the oscillating field as well as the relative spatial orientation of the two fields.

More specifically, it is necessary to monitor all the temporal, spatial and frequency characteristics of a magnetic field which may have biological effects on the human body.

It is moreover necessary to analyze the measured magnetic field characteristics in order to provide a quantity indicative of such resonance. It is particularly desirable to measure and identify magnetic field components capable of resonance with a predetermined magnetic moment, such as a magnetic moment indicative of biological resonance and more specifically indicative of resonance with the human body. Preferably, such measurement, analysis and identification should be performed in accordance with known theories of magnetic resonance.

Indeed, in some laboratory experiments [Blackman, 1990; Liboff et al., 1990], biological changes attributed to magnetic fields have been found to depend on a relation between the frequency and orientation of a oscillating field produced by AC electricity and a static magnetic field originating in the earth (the geomagnetic field).

To determine a linkage or causal relationship between magnetic resonances and cancer, spontaneous abortions or other health disorders associated with magnetic fields in epidemiological studies, instruments are thus needed to measure and monitor magnetic resonance conditions in the environment. Such instruments would be used in epidemiological studies to measure exposures to magnetic resonances of subjects in their homes, workplaces and other environments.

Moreover, if it is established that exposure to magnetic resonances is a risk factor for diseases, then magnetic resonance monitors will also be required to measure exposure to resonance conditions in order to evaluate health risks and control devices thereof.

The present invention is thus provided to permit measurement of magnetic field combinations which are, or may be, in resonance with magnetic moments in a biological organism, such as the human body.

Many systems are known for measuring exposures to magnetic fields with extremely low frequencies. However, the known systems are not suited for measuring human exposures to magnetic resonance conditions in health studies. The deficiencies of the prior art are based on the following.

1. Many systems only measure a oscillating magnetic field in frequency bandwidths which include the electric power frequency (60 Hz in North America and 50 Hz in the rest of the world). Frequencies from 30–3000 Hz is called the extremely low frequency (ELF) range. The most common sensor for measuring ELF magnetic fields is an induction coil, which responds to the oscillating fields but not to the static fields also needed for consideration in determining resonance conditions. Such common sensor systems are available from various sources, such as AJM Electronics, Electric Field Measurements, Enertech Consultants, Holaday Industries, and Positron Industries.

2. Most systems which measure both static and oscillating magnetic fields use either Hall-effect probes or fluxgate probes. Such systems are also limited, and can only determine the average magnitude of the field's component, either static or ELF. These instruments often label these two frequency modes as the "DC" and "AC" modes. Such systems are available from companies such as Bartington Instruments, F. W. Bell, Holaday Industries, and Schoenstedt Instrument Company. The magnetic field instruments with an ELF output usually determine the root-mean-squared (rms) magnitude of that field component through a frequency filter with a fixed bandwidth. Since resonance occurs at specific frequencies which vary with the magnitude of the static magnetic field, however, resonance conditions cannot be determined from the rms magnitudes measured through a pre-set frequency filter.

3. Some systems measure the frequency spectrum of the ELF magnetic fields. Such systems are available from Electric Field Measurements, Inc. and Innovatum, Inc. However, these systems do not measure the static magnetic field or the spatial orientation of the ELF magnetic field.

4. Systems which measure the spatial orientation and frequency spectrum of the static and oscillating magnetic fields simultaneously are available from Electric Research and Management, Inc. However, these systems do not analyze the signal in accordance with theories of magnetic resonance.

It is noted that the systems described at paragraph (4) measure all the physical characteristics of the static and oscillating magnetic fields, with no consideration given to any potential chemical and biological effects thereof. Consequently, these instruments are large, heavy, expensive, and demanding to operate. Interpreting the measurement results thereof requires extensive computer analysis, which is ordinarily done at a location remote from the environment where the measurements were taken.

Therefore, such systems are strictly instruments for gathering research data, unsuited for the efficient measurement and evaluation of occupational and environmental health risks from magnetic resonance conditions.

DISCLOSURE OF THE INVENTION

It is accordingly an object of the present invention to provide a measurement apparatus for measuring magnetic field combinations which are or may be in resonance with magnetic moments in a biological organism, such as the human body.

It is a more particular object of the invention to provide a monitor for measuring combined static and ELF magnetic fields to identify resonance characteristics thereof with a biological organism.

It is yet a more specific object of the invention to provide a measurement apparatus for monitoring both a frequency spectrum of ELF magnetic fields and a static magnetic field, for measuring a spatial orientation of the ELF magnetic field, and for analyzing the measurement results in accordance with theories of magnetic resonance, thereby to identify potential resonance with a biological organism.

It is yet another object of the invention to provide personal and hand-held instruments capable of conveniently measuring human exposure over time to magnetic resonance conditions in homes, workplaces, and other environments.

It is a further object of the invention to provide an instrument having a frequency bandwidth and dynamic range sufficient to measure accurately a person's exposure to magnetic resonance conditions in homes, workplaces, and other environments.

It is still a more particular object of the invention to provide an instrument for simultaneously measuring oscillating (AC) and static (DC) magnetic fields in three orthogonal directions.

It is still another object of the invention to provide a measurement apparatus for monitoring magnetic fields, including therein a filter having a variable center frequency for determining magnitudes of the oscillating (AC) field components within a bandwidth and wherein the center frequency is varied in accordance with the static (DC) magnetic field in the environment.

It is a more specific object of the invention to provide a measuring instrument for monitoring magnetic fields, including a bandpass filter for the oscillating (AC) magnetic field at a variable frequency determined by the magnitude of the static (DC) magnetic field for a pre-selected magnetic moment.

It is a more particular object of the invention to analyze the oscillating (AC) magnetic field into three spatial components in the static (DC) magnetic field frame of reference, i.e. the component parallel to the static field vector and the two circularly polarized components which are perpendicular to the static field vector with opposite directions of rotation (called plus and minus helicity).

It is an additional object of the invention to provide an instrument for measuring spatial components of an oscillating (AC) magnetic field capable of resonance with the pre-selected magnetic moment.

Still a further object of the invention is to provide an instrument for measuring and analyzing frequency and spatial characteristics of an environmental magnetic field, including an analyzer operating in accordance with the theory of magnetic resonance.

It is a more specific object of the invention to measure directly a resonance yield of a magnetic field, defined as a change in the rate of chemical reactions involving resonances between the magnetic moments in a person's body and the magnetic fields in the environment.

It is still another object of the invention to provide an instrument for electronically determining resonance yields and for providing a real-time display of resulting resonance yield data in a digital or other display.

A further object of the invention is to provide a magnetic resonance monitor having a data logger for storing the time of measurement and a measured resonance yield from the environmental magnetic field and magnetic moments of the user's body, thus enabling subsequent retrieval, display and analysis of a time pattern of the user's exposure.

In accordance with the invention, there is accordingly provided a device for measuring magnetic resonance between magnetic moments in an object and a multi-dimensional magnetic field including static and oscillating components. The device includes a probe section which detects static and oscillating components of a magnetic field and puts out a first (DC) signal and a second (AC) signal for the three spatial dimensions. The inventive measuring device further includes a resultant analyzer receiving the first signal for generating and outputting a resultant signal representative of a magnitude of the static component of the magnetic field. A digital filter which is responsive to the resultant signal is used for establishing a central frequency for filtering the second signals representative of the oscillating component of the magnetic field, and for outputting filtered signals representative of the oscillating component of the magnetic field. A phase analyzer receives the filtered signal for outputting phase signals and magnitude signals respectively indicative of phases and magnitudes of the oscillating component of the magnetic field. A spatial analyzer receives the phase signals and the magnitude signals and the first signals for outputting a parallel signal, a plus helicity signal, and a minus helicity signal, indicative of the components of the oscillating component of the magnetic field which are respectively parallel and perpendicular to the static magnetic field. A resonance analyzer receives the resultant signal, the parallel signal, the plus helicity signal and the minus helicity signal for determining a resonance yield of the magnetic field, thereby identifying a change in a rate of chemical reactions involving resonances between the magnetic moments in the object and the multi-dimensional magnetic field. Typically the multi-dimensional field is a three dimensional magnetic field, and the resonance analyzer identifies a change in a rate of chemical reaction involving resonance between the magnetic moments in the object and the three-dimensional magnetic field.

In accordance with the invention, the digital filter operates for implementing a gyromagnetic equation to establish the center frequency thereof.

Additionally, the filter has a variable bandwidth. The invention further includes a digital memory for storing a bandwidth parameter to control the bandwidth of the filter in accordance with data for a biological substrate containing the magnetic moment.

Preferably, the spatial analyzer of the invention determines a parallel and perpendicular components of the oscillating component of the magnetic field. The parallel component of the oscillating field is parallel to a static field vector defined by the three spatial components of the static field. The two perpendicular components are magnetic field vectors rotating in circular paths (circular polarization) in a plane perpendicular to the static field vector with the directions of rotation (helicity) of the vectors being opposite to each other [Jackson, 1962].

Such a measuring device may further include a yield computing device for computing a resonance yield for the magnetic field and the object. The yield computing device includes a digital memory for storing a formula identifying resonance yield for the object in accordance with at least one interaction of either the parallel component or the circularly polarized components of the magnetic fields with a particular magnetic moment.

In accordance with another aspect of the invention, there is provided an improvement in a measuring device for measuring magnetic fields which includes a probe for detecting static and oscillating components of a magnetic field and for outputting first and second signals respectively representative of the components. The improvement includes a resonance detector for measuring resonance between magnetic moments in an object and a three-dimensional magnetic field having static and oscillating components, and further includes a filter for the second signals, wherein the filter has a variable center frequency and bandwidth. The filter includes a control input receiving a signal for controlling the center frequency, and for outputting filtered signals representative of the oscillating component of the magnetic field.

A spatial analyzer analyzes the filtered and first signals for the three spatial components of the oscillating field and outputs signals representing magnitudes of a parallel oscillating component, oscillating parallel to a static field vector, and oppositely-rotating circularly-polarized components of the oscillating magnetic field.

A resonance analyzer is included for analyzing the parallel and circular magnitude signals to identify a resonance yield of the magnetic field and for providing a yield signal indicative thereof.

In accordance with a feature of the invention, the improvement includes a resultant calculator connected for receiving the first signals, in digital form, from the analog to digital converter and for outputting a resultant signal indicative of a magnitude of the static component of the magnetic field, as well as outputting individual directional components of the static field. The filter is connected for receiving the second signals, in digital form, from the analog to digital converter and for receiving the resultant signal from the resultant calculator at the control input, and is responsive to the resultant signal for con-trolling a center frequency for filtering the second signals according to the gyromagnetic equation.

In such a configuration, a phase analyzer receives the filtered signals from the filter and performs a phase analysis thereon. The phase analyzer outputs phase signals, indicative of the relative phases of the three directional components of the filtered signals, and magnitude signals, indicative of root-mean-squared magnitudes of the three directional components of the filtered signals. The spatial analyzer, which receives the phase signals and the magnitude signals from the phase analyzer, generates the parallel and circular magnitudes therefrom.

The inventive monitor further preferably includes an output device for displaying or for storing the yield signal, or for logging the same as a function of time.

These and other objects, features and advantages of the present invention will become readily apparent to those skilled in the art from the following description and drawings, wherein there is shown and described a preferred embodiment of the invention, simply by way of illustration and not of limitation of one of the best modes (and alternative embodiments) suited to carry out the invention. The invention itself is set forth in the claims appended hereto. As will be realized upon examination of the specification and drawings and from practice of the same, the present invention is capable of still other, different, embodiments and its several details are capable of modifications in various obvious aspects, all without departing from the scope of the invention as recited in the claims. Accordingly, the drawings and the descriptions provided herein are to be regarded as illustrative in nature and not as restrictive of the invention.

BRIEF DESCRIPTION OF THE DRAWINGS

The accompanying drawings, incorporated into and forming a part of the specification, illustrate several aspects of a preferred embodiment of the present invention and, together with the description, serve to explain the principles of the invention. In the drawings.

BEST MODE FOR CARRYING OUT THE INVENTION

Figure 1:
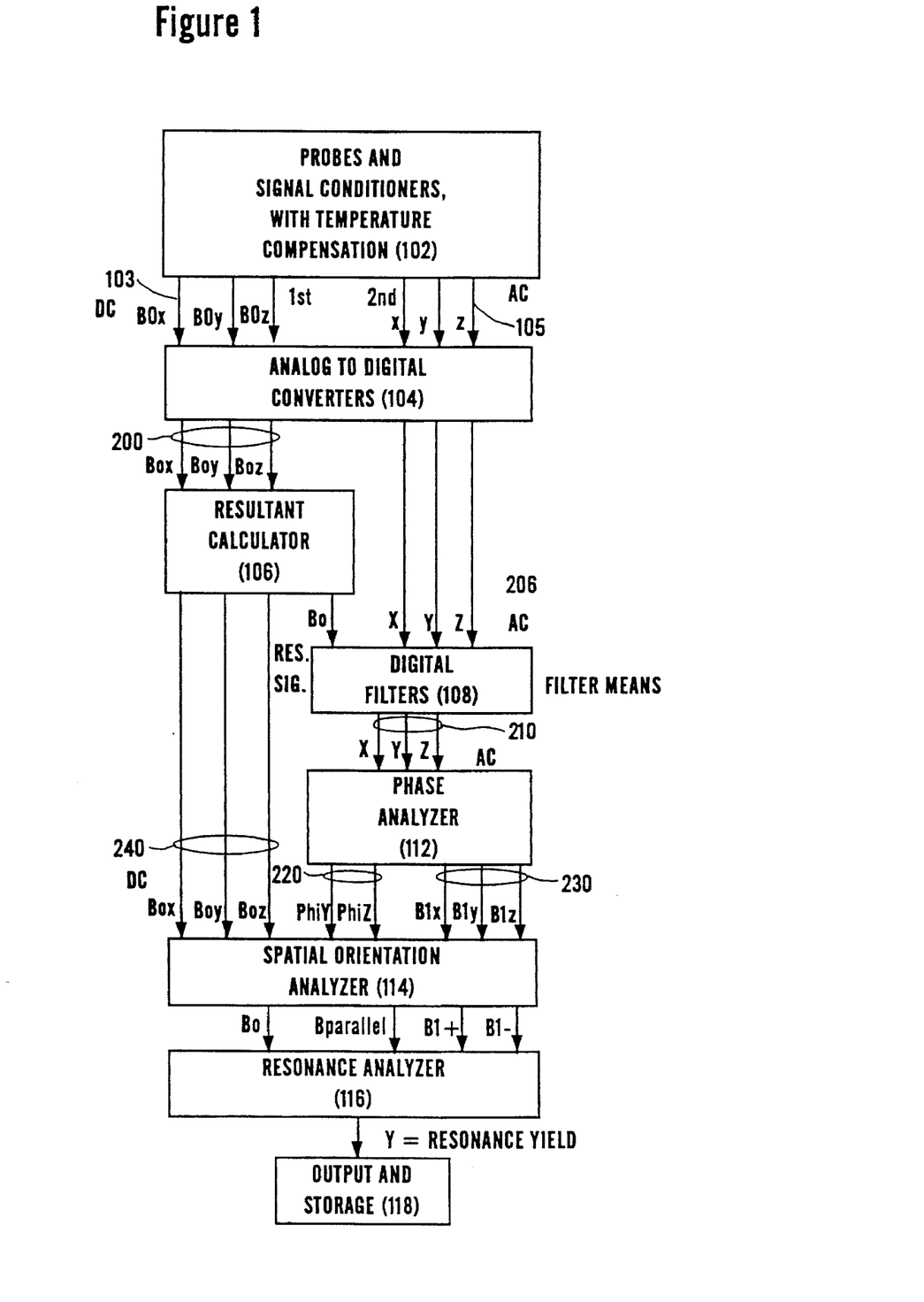
FIG. 1 shows a block diagram of the general framework for the magnetic resonance monitor in accordance with the invention.

Referring now to the drawings, there is shown in FIG. 1 an implementation of a magnetic resonance monitor in accordance with the invention. In order to appreciate functioning of the inventive monitor, the following description is first provided to identify the theoretical basis of the invention. In that regard, although the following disclosure refers to a human body, it should be understood that the inventive apparatus is contemplated for measurement and monitoring of magnetic fields to identify potential resonance in any object, which may be a biological organism such as a human body, but is not necessarily limited to identification of resonance with either a human body or a biological organism.

The specific magnetic field characteristics which are capable of resonance with biological magnetic moments may be deduced using theories from the fields of physics and chemistry [Macomber, 1976; Liboff and McLeod, 1988; Steiner and Ulrich, 1989; Lednev, 1991]. The magnitude of the magnetic moment, the frequency of the oscillating magnetic field, and the magnitude of the static field obey a gyromagnetic equation. Moreover, the strength of the resonance established between the magnetic field and an object subjected to the field, such as a biological organism or a human body for example, depends on the spatial alignment between the oscillating and static magnetic fields. If these resonance conditions are met, the rates of biochemical reactions within the object which involve the magnetic moments may be altered, thus changing the yield of biological molecules in an organism, for example.

Applicants have concluded that quantification of magnetic resonance conditions therefore requires simultaneous measurement of the static and oscillating magnetic field magnitudes in the object's environment, followed by a signal analysis of the field's frequency and spatial orientation in accordance with the theory of magnetic resonance.

Figure 2:
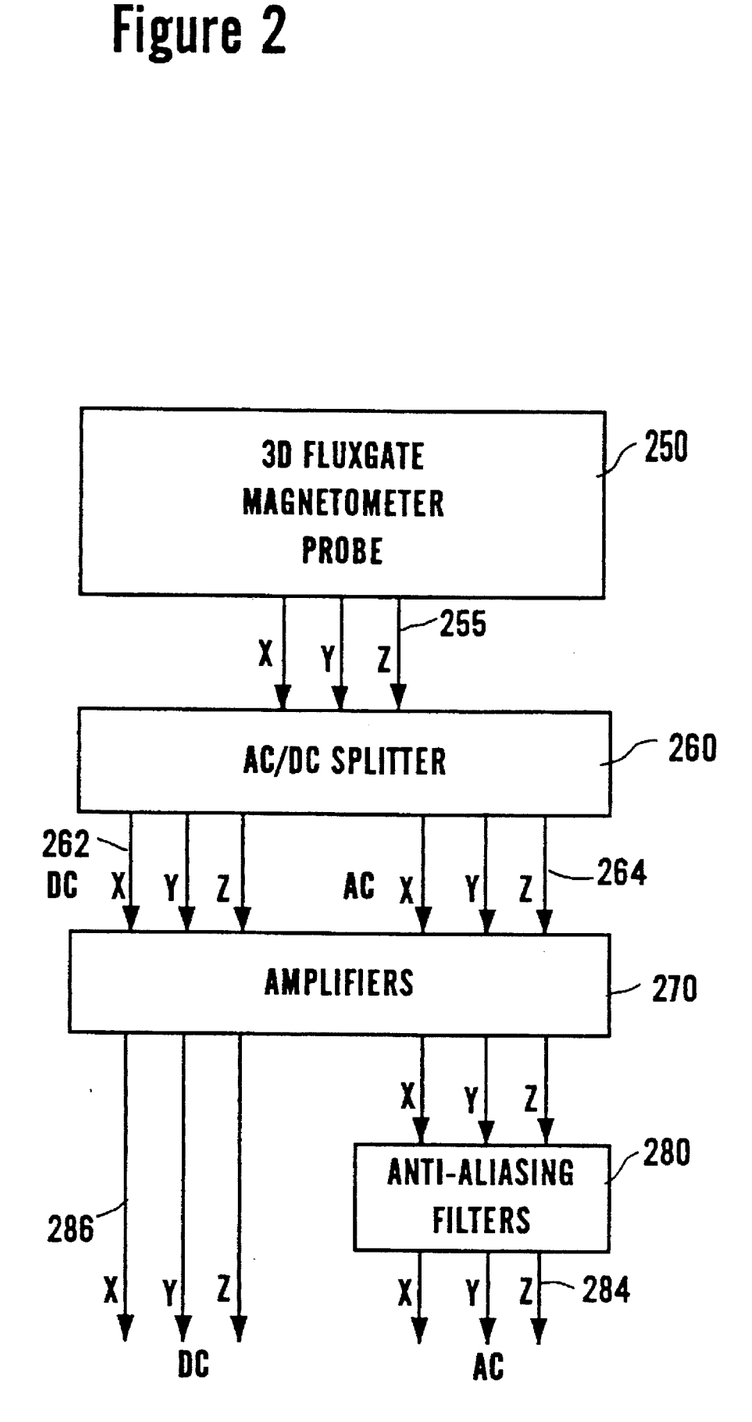
FIG. 2 shows a block diagram of the probes and signal conditioners for routine magnetic fields in accordance with the invention.
Figure 3:
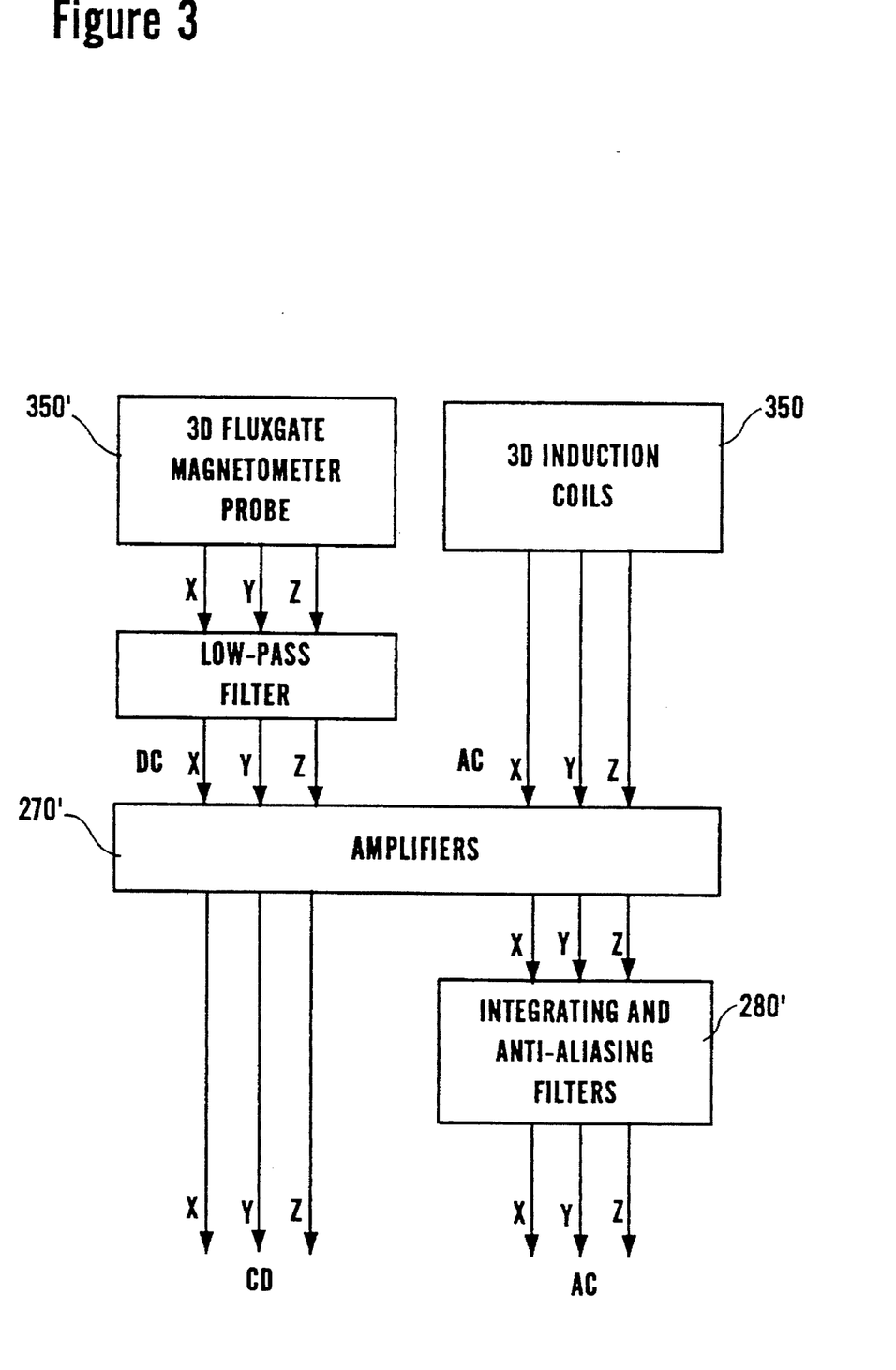
FIG. 3 shows a block diagram of the probes and signal conditioners for higher magnitude and/or higher frequency magnetic fields in accordance with the invention.
Figure 4:
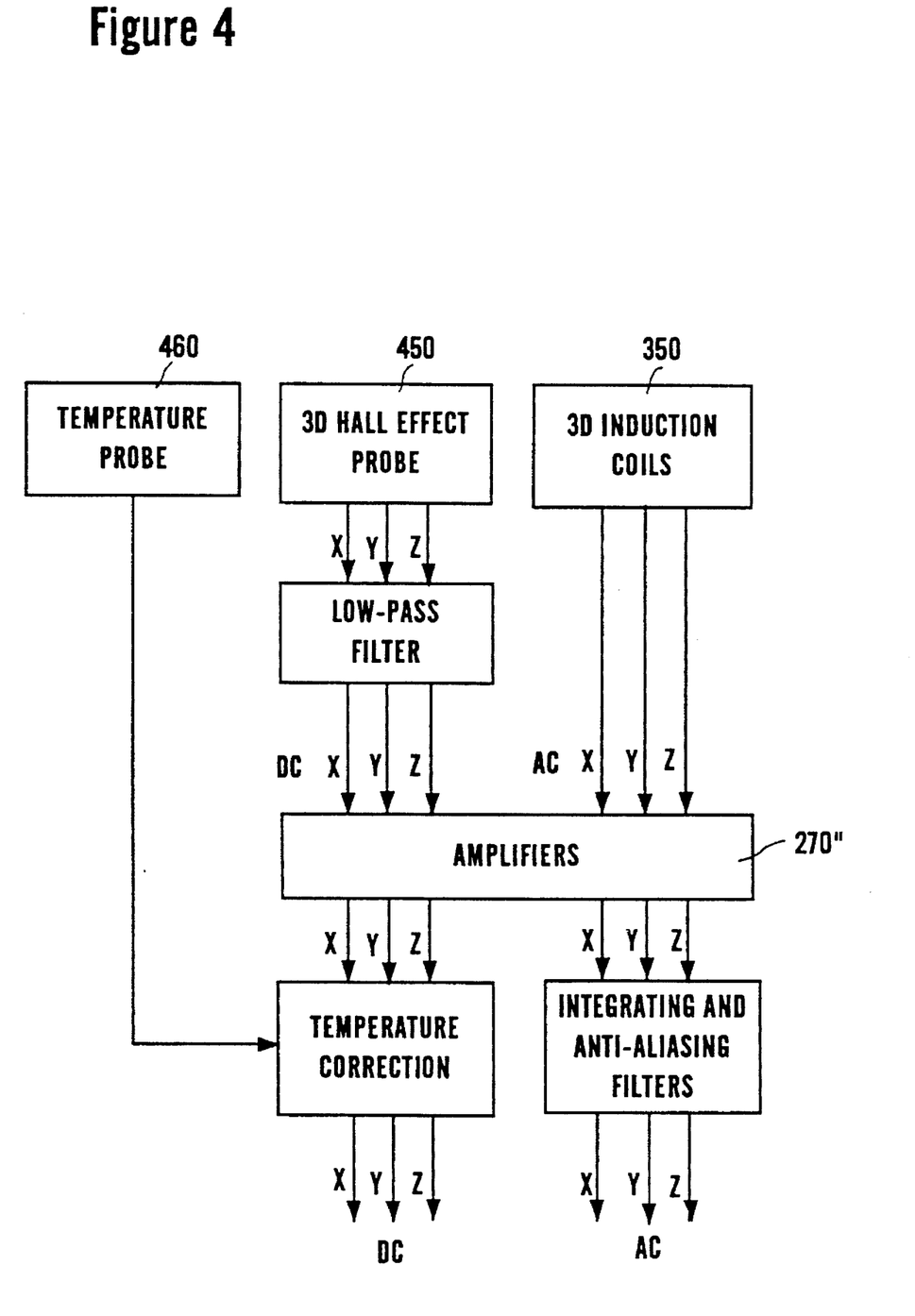
FIG. 4 shows a block diagram of the probes and signal conditioners for higher static magnetic fields in accordance with the invention.

Most residential and occupational magnetic fields can be accurately measured with a three-axis fluxgate magnetometer probe 250 (i.e., a "3D" probe), which responds to both the static and oscillating components of the field [Bartington Instruments Ltd., 1993]. Such an arrangement is shown in FIG. 2, wherein an AC/DC splitter 260 provides output signals 262, 264, representative of the static and oscillating components of the magnetic field, respectively. A set of amplifiers 270 and anti-aliasing filters 280 are used to output signals for processing. In the embodiments of the invention designed for more extreme fields, a separate set of three orthogonal induction coils 350 (as in the Enertech Consultants EMDEX II) can be used to measure oscillating magnetic field with higher magnitudes and or higher frequencies as shown in FIG. 3. 3D Hall-effect probes 450 can measure the high-magnitude static fields as shown in FIG. 4. After amplification, conditioning and frequency filtering as described below, the probe outputs emerge as three AC signals 284 (one for each spatial direction), and three DC signals 286, $B_{(ox)}$, $B_{(oy)}$, and $B_{(oz)}$. These six signals represent the environmental magnetic field in the frequency and magnitude ranges which each embodiment of the invention is designed to measure.

As will be described with reference to FIG. 1, the magnitude of the static magnetic field, $B_{(o)}$, is determined from the three DC signals 286 outputted from the static magnetic field probes, and is specifically determined by electronic circuitry 106 which takes the resultant of the three DC signals in accordance with equation (1):

$$B_{(o)} = \text{Square Root } [B_{(ox)}^2 + B_{(oy)}^2 + B_{(oz)}^2] \quad (1)$$

In accordance with the invention, three AC signals 204 are passed through digital filters 108 which are configured as variable bandpass filters whose central frequency $f_{(o)}$ obeys the gyromagnetic equation (2):

$$f_{(o)} = n * \text{gamma} * B_{(o)}/2 * \text{pi} \quad (2)$$

where n is an integer or a fraction representing harmonics, gamma is the gyromagnetic ratio for the magnetic moment, and pi is the fundamental constant 3.14159 . . .

In accordance with the invention, the resonance monitor of the invention processes these filtered signals according to magnetic resonance theory resulting in a signal useful for ascertaining the resonance yield Y, defined as the percent change in a chemical reaction rate due to resonances between the magnetic fields in the environment and a selected magnetic moment in a biological substrate, such as a protein or a cell membrane.

The inventive monitor may thus be mounted on a stand for measuring magnetic resonance in workplaces, homes and other environments of interest. Alternatively, the inventive monitor may be carried by hand or placed on individuals for monitoring personal exposure to magnetic resonance conditions and identifying a resonance yield of the magnetic fields to which the individuals have been exposed. However, the accuracy of the spatial orientation measurements is lessened if the probe is moving.

Referring now specifically to the embodiment of FIG. 1, a magnetic resonance monitor in accordance with the invention is generally shown at 100. As shown in FIG. 1, the preferred embodiment of the invention includes, at a block 102 of the monitor, the above noted probes, as well as signal conditioners, amplifiers, signal splitters, and anti-aliasing filters for the outputs of the probes, including temperature compensation for any Hall-effect probes (as shown in FIG. 4).

The three different type of probes and signal conditioning arrangements shown in FIGS. 2–4 may be selected in accordance with the range of magnitudes and the range of frequencies in a particular magnetic field environment. Commercially-available 3D flux-gate magnetometer probes (e.g. Bartington Instruments Ltd. model MAG-03MC) can measure both static and ELF magnetic fields from 1 nanoTesla (10 microGauss) up to 0.5 milliTesla (5 Gauss) with a frequency bandwidth from 0 Hertz (static fields) to 1000 Hertz. Hall-effect sensors (Group 3 Technology, Ltd.) can measure both the static and ELF magnetic fields with magnitudes up to 3 Tesla (30 kiloGauss) and frequencies up to 5000 Hertz, but have a high limit of detection (±1 microTesla or ±10 milliGauss). Induction coils do not measure the static magnetic field. However, induction coils have the bandwidth and dynamic range to measure all of the ELF magnetic fields encountered in the environment (frequencies up to 30 kilohertz and magnitudes from 1 nanoTesla to 2 milliTesla).

As hereinabove noted, for most residential and occupational magnetic fields, a 3D fluxgate magnetometer probe 250 suffices to measure accurately both the static and oscillating field components (FIG. 2). For high static magnetic fields, such as those resulting from DC electricity, a 3D Hall-effect 450 probe will be used (FIG. 4). If the oscillating magnetic field in the environment has magnitudes outside the dynamic range of the static field probe (either fluxgate or Hall-effect), 3D induction coils 350 will be needed as well, as shown in FIG. 3. 3D induction coils 350 will also be needed if the oscillating field has frequencies above the bandwidth of the static field probes.

Separate probes will be needed for the static and oscillating fields in order to measure accurately magnetic resonance conditions resulting from sources in various occupational embodiments, such as electrical power substations, underground power vaults, aluminum refining plants, electrosteel refining, induction furnaces, welding sites, and other sources still to be determined.

If the system has a Hall-effect probe 450, temperature corrections are needed to produce accurate magnetic field measurements (FIG. 4). Accordingly, an embodiment of the inventive monitor which uses Hall-effect probes 450 also includes a temperature probe 460 which monitors temperatures in the range of −10 to 40 degrees centigrade. The output signal from the temperature probe is used to provide the necessary correction for the output of the Hall-effect probe in a known manner [Popovich, 1991].

Depending on the probe configuration, the resonance monitor of the invention receives three DC signals 103, $B_{(0x)}$, $B_{(0y)}$, and $B_{(0z)}$, from the static field probes and three AC signals 105 from the probes for the oscillating magnetic field components in three spatial dimensions. Alternatively, the monitor can receive three composite signals 255 from a fluxgate probe representative of the total (static+oscillating) magnetic field components in the three spatial dimensions, as shown at FIG. 2. In that case, the invention feeds the three composite signals into splitters 260 for separating the oscillating from the static components. Each of the three splitters consists of a low-pass filter set at 1 Hz from which DC signal emerges and a matching high-pass filter for the AC signal. The splitters therefore output six signals, three DC signals 262 and three AC signals 264, representative of the static and oscillating components of the magnetic field, respectively.

The signals from the probes (or from the splitters, if necessary) are fed into instrumentation amplifiers 270, as shown in FIGS. 2–4, which are designed for the specific dynamic range, bandwidth and probe configuration of the system. The gain of the instrumentation amplifiers can be fixed to match the probes' output signal magnitudes to a calibrated field level for input to the Analog to Digital converter (ADC) 104 of FIG. 1. Alternatively, the gain may be set by the operator or by auto-ranging circuitry in a known manner.

The outputted signals of the instrumentation amplifiers are fed into a set of anti-aliasing filters so that the signals' frequencies fit the bandwidth of the ADC 104. With induction coil probes, the voltages induced in the coils is proportional to the time-derivative of the magnetic flux density. Thus, in an embodiment using induction coil probes, the filters in block 102 may include an integrator therein, to provide compensation in a known manner.

The analog-to-digital converter (ADC) 104 is included in the embodiment of FIG. 1 for digitizing the three DC and three AC signals outputted by the signal conditioners of block 102. The ADC 104 is capable of sampling the various signals at rates up to twice the maximum frequency of the anti-aliasing filters. The analog-to-digital converter 104 is preferably of a type providing at least 12 bits of resolution on at least 8 channels and a conversion rate of at least 24 kSamples/Second (e.g. Model PC-30D analog and digital I/O board, Industrial Computer Source). It should be noted that the instrumentation amplifiers of block 102 also provide the appropriate scaling to match the input range of the ADC 104.

Figure 5:
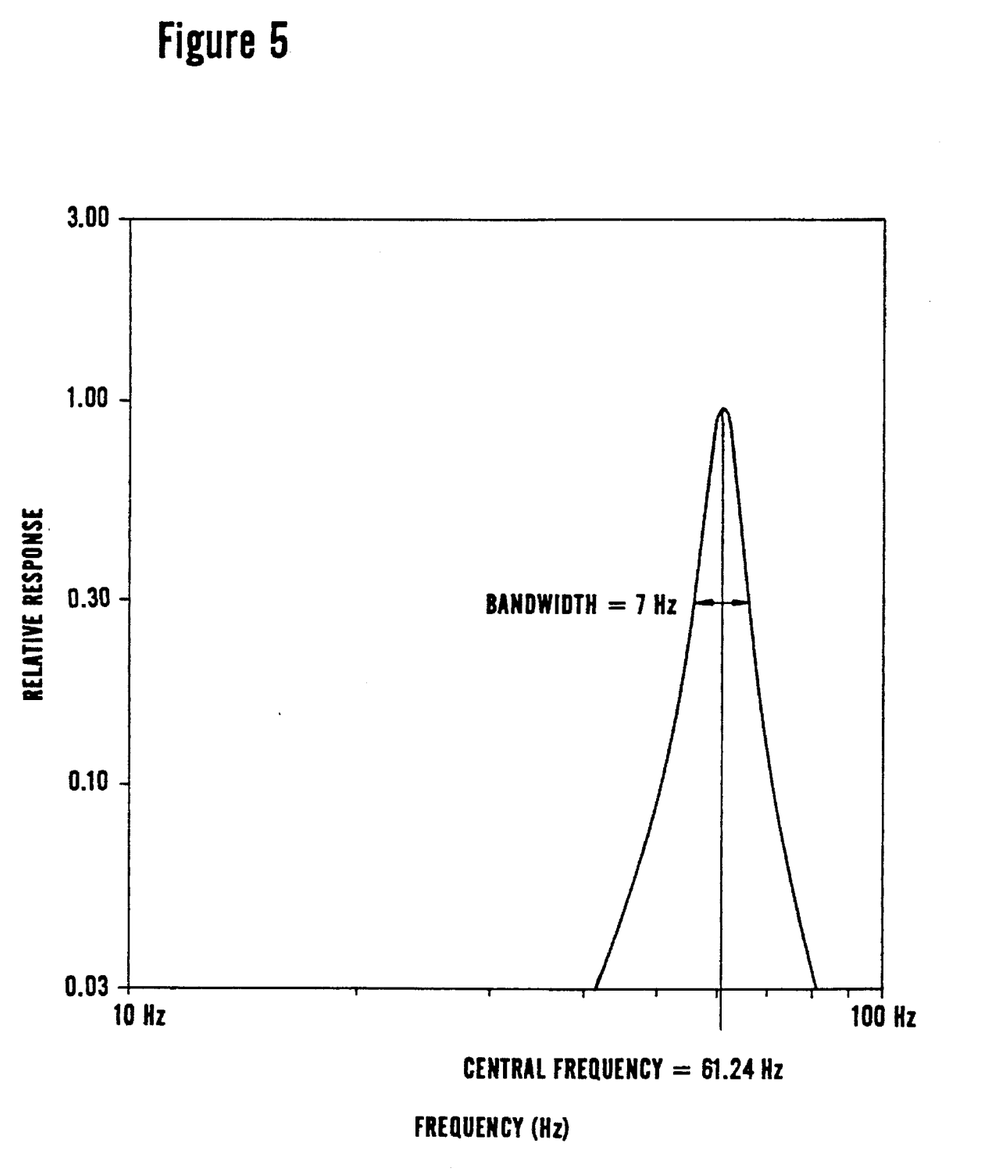
FIG. 5 shows the relative response of the digital filter with specific exemplary values for the central frequency and bandwidth.

As shown in FIG. 1, the three digitized DC signals 200 outputted from ADC 104 are inputted into a resultant calculating circuit 106 which determines the resultant static magnetic field $B_{(o)}$ in accordance with equation (1) above. The resultant calculation, as with all calculations with the digitized signals, is performed by programming in a known manner the appropriate equations onto a microprocessor (e.g. Tattletale Model V). A resultant value signal $B_{(o)}$ is outputted by circuit 106 for input as a filter control signal to a digital filter 108, which filters each of the AC signals 206 digitized by ADC 104. Digital filter 108 sets the center frequency thereof for a particular harmonic according to the gyromagnetic equation (2) in response to the inputted filter control signal $B_{(o)}$. FIG. 5 shows a particular filter response which may be set in accordance with a specific value of the signal $B_{(o)}$. Moreover, the parameter gamma in equation (2) and the bandwidth of the digital filter are constants determined from biological experiments. The bandwidth parameters are stored in an electronic memory in the monitor (not shown). Thus, to measure the resonance yield in a particular biological substrate, biological experiments with similar substrates are used to determine the bandwidth, and the constant gamma needed to define the digital filter 108 in response to the signal $B_{(o)}$. Digital filter 108 produces three AC signals 210, with frequencies in a narrow band at which resonance occurs.

In accordance with the invention, the relative phases of the AC signals are determined by a phase analyzer 112, which obtains the phases and magnitudes of the three AC signals 210 and outputs the same as signals 220 and 230, respectively. Phases phi(y) and phi(z) for the AC signals in the y- and z-channels are determined relative to the x-channel by Fourier transforms. The two phase signals 220 are outputted by phase analyzer 112. However, in addition to determining the phases, phase analyzer 112 also obtains the root-mean-square (rms) values $B_{(1x)}$, $B_{(1y)}$, and $B_{(1z)}$ of the three time-dependant AC signals outputted by digital filter 108, and outputs the same as the three signals 230. The rms magnitudes and the phases are used by a spatial orientation analyzer 114 to determine the spatial orientation of the oscillating magnetic field vector relative to the static field vector.

The above described signal transformations are well-known [Jackson, 1991], and, with the guidance provided in the foregoing description of the invention, may be combined in the manner hereinabove described.

The spatial orientation analyzer 114 receives as its inputs the phase and magnitude signals 220 and 230 outputted by phase analyzer 112. Additionally, analyzer 114 receives as inputs the magnitudes of three signals 240, representing the three components, $B_{(ox)}$, $B_{(oy)}$, and $B_{(oz)}$, of the static magnetic field. These signals are provided to the analyzer by the circuit 106. In response to these eight signals, the spatial orientation analyzer 114 uses mathematical co-ordinate transformations to transform the magnitudes of the oscillating magnetic field into the co-ordinate system defined by the static magnetic field vector, which is the frame of reference needed for the resonance analysis. This transformation is described as follows.

In the co-ordinate system of the static field, the oscillating magnetic field with a narrowly-filtered frequency may be expressed by the rms magnitude of the component parallel to the static field vector, $B_{(parallel)}$, and two magnitudes, $B_{(1+)}$ and $B_{(1-)}$, of circularly polarized fields in the plane perpendicular to the static field vector [Jackson, 1962;

Condon and Shortley, 1967]. The plus and minus subscripts refer to the direction of the field vector's rotation (often called the vector's helicity). $B_{(1+)}$ rotates in the direction of the threads of a right-hand screw pointing along the static field vector, while $B_{(1-)}$ rotates in the opposite direction. The magnetic field's parallel and perpendicular components with plus and minus helicity determine magnetic resonance transformations [Condon and Shortley, 1962; Macomber, 1976]. The three rms magnitudes representing the oscillating magnetic field are expressed by equations (3) and (4), as follows:

$$B_{(parallel)} = \text{sqrt}[(B_{(1x)}B_{(0x)})^2 + (B_{(1y)}B_{(0y)})^2 + (B_{(1z)}B_{(0z)})^2 + \qquad (3)$$
$$2 B_{(1x)}B_{(0x)}B_{(1y)}B_{(0y)} \cos(\text{phi}_{(y)}) +$$
$$2 B_{(1x)}B_{(0x)}B_{(1z)}B_{(0z)} \cos(\text{phi}_{(z)}) +$$
$$2 B_{(1y)}B_{(0y)}B_{(1z)}B_{(0z)} \cos(\text{phi}_{(y)} - \text{phi}_{(z)})]/B_{(o)}$$

$$B_{(1\pm)} = \text{sqrt}\{B_{(1x)}^2 [B_{(0x)}^2 \cot^2(\text{theta}) + B_{(0y)}^2 \csc^2(\text{theta})] + \qquad (4)$$
$$B_{(1y)}^2 [B_{(0y)}^2 \cot^2(\text{theta}) + B_{(0x)}^2 \csc^2(\text{theta})] +$$
$$B_{(1z)}^2 B_{(o)}^2 \sin^2(\text{theta}) +$$
$$2 B_{(1x)}B_{(1y)} [-B_{(0x)}B_{(0y)} \cos(\text{phi}_{(y)}) \mp B_{(o)}B_{(0z)} \sin(\text{phi}_{(y)})] +$$
$$2 B_{(1x)}B_{(1z)} [-B_{(0x)}B_{(0z)} \cos(\text{phi}_{(z)}) \pm B_{(o)}B_{(0y)} \sin(\text{phi}_{(z)})] +$$
$$2 B_{(1y)}B_{(1z)} [-B_{(0y)}B_{(0z)} \cos(\text{phi}_{(y)} - \text{phi}_{(z)}) \pm$$
$$B_{(o)}B_{(0x)} \sin(\text{phi}_{(y)} - \text{phi}_{(z)})]\}/B_{(o)}/\sqrt{2}$$

where $\text{theta} = \tan^{-1}[(B_{(0x)}^2 + B_{(0y)}^2)^{1/2}/B_{(0z)}]$ is the angle between the probe's z-axis and the static field vector.

As will be appreciated by those skilled in the art, equations (3) and (4) may be easily implemented on a miniature programmed computer or microprocessor for application to the signals 220 and 230 representing the phase and magnitude of the oscillating magnetic field, inputted from phase analyzer 112, by use of the components of the static magnetic field, inputted as signal 240 from circuit 106. Thus, spatial orientation analyzer 114 preferably includes a microprocessor operating in accordance with a stored program to implement the above transformations for the signals received from the phase analyzer 112 and circuit 106. Similarly, it should be appreciated that the resultant calculation of circuit: 106 and the digital filter function of filter 108 may be performed by the same microprocessor implementing equations (3) and (4), by a separate microprocessor, or by other computer structure, when appropriately programmed to implement the above described functions.

In order to obtain the desired resonance yield, the inventive monitor further includes a resonance analyzer 116, which receives as its inputs the resultant signal $B_{(o)}$ and the parallel and perpendicular components $B_{(parallel)}$, $B_{(1+)}$, and $B_{(1-)}$ outputted by spatial orientation analyzer 114. From these inputs, the resonance analyzer 116 determines the resonance yield Y, the percent change in biochemical reactions due to the magnetic resonance exposure. The resonance yield is outputted to read-out and electronic storage devices 118 for display, as a hard copy output, or for storage.

The signal processing performed by analyzer 116 is the evaluation of the resonance yield in accordance with formulae stored in the monitor's electronic memory and selected by the operator. Different resonance mechanisms are described by different formulae and exhibit different resonance yields in response to a given magnetic field.

For example, the resonance yield Y from the parametric resonance mechanism [Lednev, 1991] is described by equation (5):

$$Y = b J_{(n)}(n B_{(parallel)}/B_{(o)}) \qquad (5)$$

where b is a preset parameter dependant on the biological substrate (which is also stored in the memory associated with the computer implementing the resonance analyzer), and $J_{(n)}$ is the Bessel function of order n.

Cyclotron resonance, radical pair reactions, magnetosome interactions, and other mechanisms involving biological magnetic moments have been proposed as explanations for the reported biological effects of low-frequency magnetic fields. The biological yield resulting from magnetic field exposures under such mechanisms can be estimated from expressions similar to equation (5), which are published in the scientific literature and can also be evaluated by the resonance analyzer.

It should be appreciated that the monitor may include a single memory for each or for all of the parameters, equations and programs used by any or all of the various components thereof. Alternatively, various components may each include its own dedicated storage. Thus, digital filter 108 may include storage for the bandwidth parameter to be used by the filter for one or more specific biological substrate(s), as well as for storing the gyromagnetic ratio for the magnetic moment, and for storing pi, the storage being dedicated for use by the filter. Similarly, resonance analyzer 116 may include a separate storage for storing an operating program to implement the -transformations of equations (3), (4) and (5), for example, as well as for any trigonometric or other mathematical functions needed to implement the transformations. On the other hand, a single storage element may be used to store both the parameters for filter 108 and the operating programs and parameters for resonance analyzer 116.

Figure 6:
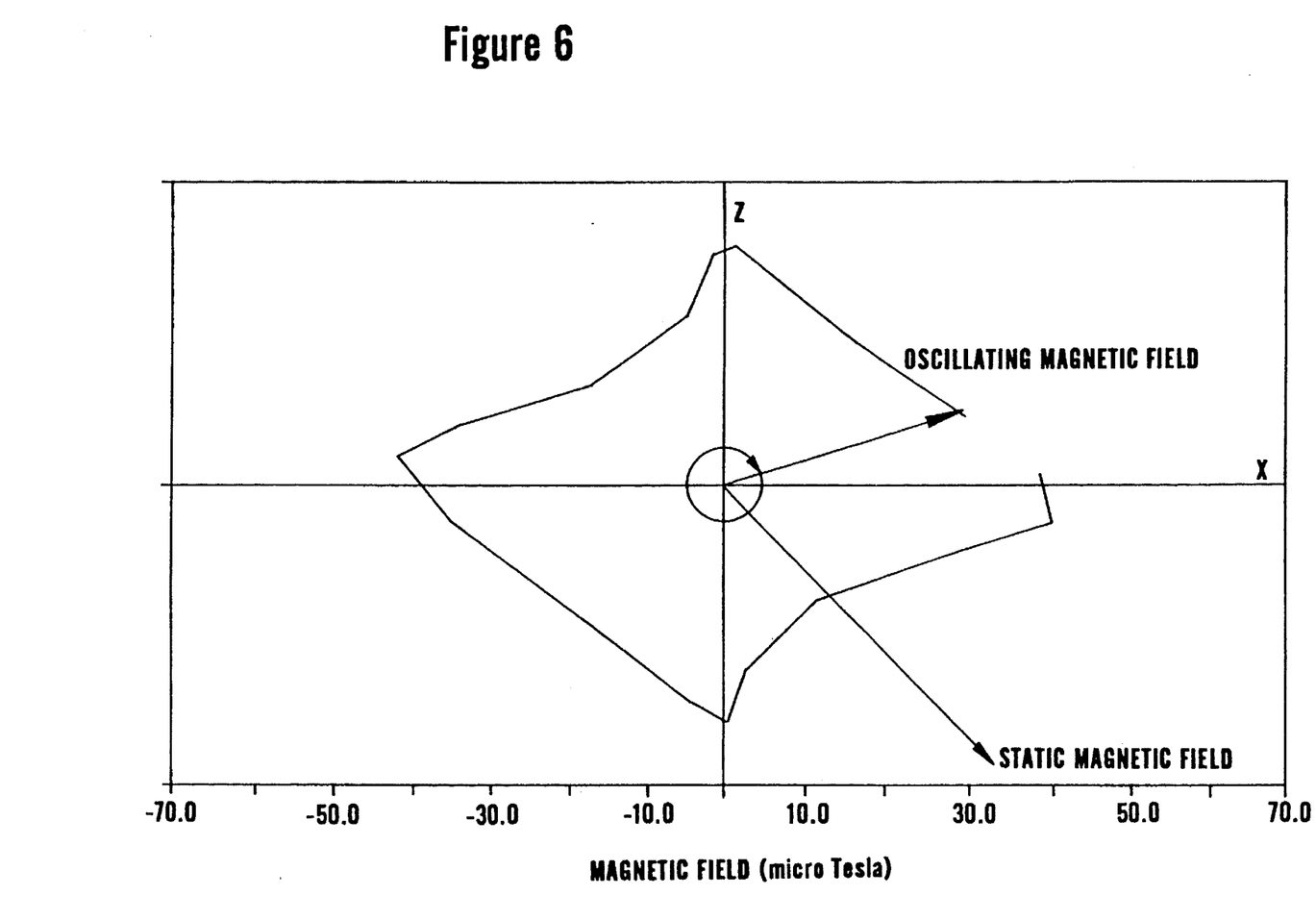
FIG. 6 shows a two-dimensional magnetic field to illustrate three-dimensional fields which may be found in a workplace.

Functioning of the resonance monitor of the present invention is illustrated in the following example, considering the oscillating and static magnetic fields shown in FIG. 6. Although a two-dimensional example is presented for clarity and for ease of comprehension, the principles described herein may be easily and clearly extended to three dimensions. The example of FIG. 6 includes a static magnetic field having an 80 μT (microTesla) magnitude and a 60 degree inclination from the vertical. Such values are typical for the geomagnetic field perturbed by large steel objects in workplaces. The oscillating magnetic field of the example has a primary frequency of 60 Hz (Hertz) with a rms magnitude of 40 microTesla. Harmonic distortion at 180 Hz is also present. Such oscillating fields are found in electrical distribution substations and other workplaces with high electrical currents.

Figure 7:
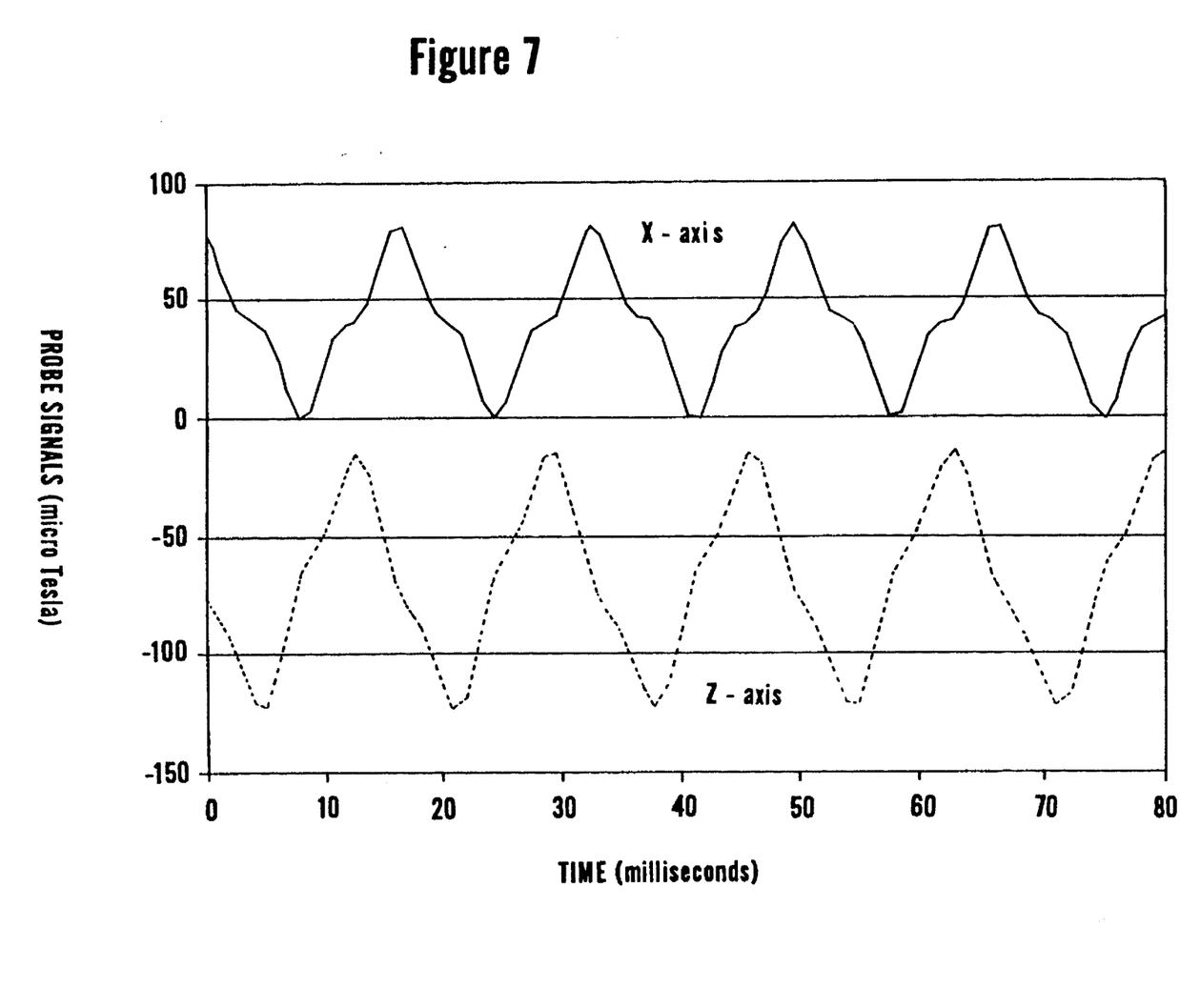
FIG. 7 shows signals provided by a resonance monitor of FIG. 1 for the magnetic field in FIG. 5, with fluxgate magnetometer probes of the monitor oriented along the x- and z-axes

FIG. 7 shows the response of the monitor hereinabove described to the magnetic field environment in FIG. 6. In this example the resonance monitor is equipped with two fluxgate magnetometer probes oriented along the x- and z-axes, and the signals from these probes (calibrated in microTesla) are shown in FIG. 7. After these signals pass through the signal splitter 260 preceding the amplifiers, the DC signals are 40 microTesla in the x-channel and 69.3 microTesla in the z-channel, and the resultant $B_{(o)}$ outputted from circuit 106 is given by equation (1), as shown in equation (6):

$$B_{(o)} = \text{Square Root } [B_{(ox)}^2 + B_{(oz)}^2] = 80 \text{ microTesla} \qquad (6)$$

The circuit 106 may be implemented in a straightforward manner as a computer programmed to execute equation (6).

As an illustration of application of the foregoing, there was evaluated the resonance yield from the parametric resonance mechanism [Lednev, 1991] with the magnetic moment created by a calcium ion moving in a protein. In this example, the gyromagnetic ratio gamma equals 4.81 Hertz/microTesla, and, pursuant to the gyromagnetic equation (2), the resonance frequency for the first harmonic (n=1) is given by equation (7):

$$f_{(o)} = n * \text{gamma} * B_{(o)}/2 * pi = 61.24 \text{ Hz} \tag{7}$$

This is the frequency at which the digital filter 108 centers the bandpass upon receiving the input value for $B_{(o)}=80$ microTesla from circuit 106. For this example, the filter's bandwidth was set at 7 Hz, because this value has been reported in a biological experiment. Experimentally reported values may thus be used to set the bandpass for the digital filter 108. Thus, the digital filter passes the 60 Hz component of the AC signal to the phase analyzer, and filters out the 180 Hz component.

For the phase analysis, the relative phase of the two AC signals filtered to 60±7 Hz is seen to be 90 degrees. The two AC signals which pass through the digital filter have rms magnitudes $B_{(1x)}=B_{(1z)}=40$ microTesla (circularly polarized in the x-z plane).

The phases and magnitudes of the two filtered AC signals and the two DC signals are then passed into the resonance analyzer. In order to evaluate parametric resonances, only the parallel component of the oscillating magnetic field must be evaluated from Equation (3), as shown at Equation (8):

$$\begin{aligned} B_{(parallel)} &= \text{sqrt}[(B_{(1x)}B_{(0x)})^2 + (B_{(1z)}B_{(0z)})^2 + \\ &\quad 2 B_{(1x)}B_{(0x)}B_{(1z)}B_{(0z)} \cos(\text{phi}_{(z)})]/B_{(o)} \\ &= 40.0 \text{ microTesla} \end{aligned} \tag{8}$$

Finally, the resonance analyzer determines the resonance yield from equation (5) retrieved from its memory.

If the substrate parameter b is set equal to 100%, then the resonance yield obtained from this measurement by using Equation (5) is 24.2%. This value would be displayed on a display associated with the monitor, provided as a hard copy output thereof, or stored by the monitor's read-out and electronic storage device 118.

These measurements of the resonance yield are repeated at the sampling rate set for the monitor. Similar electronic devices have minimum processing times between 0.1–1 second, which is sufficient for evaluating personal exposures. However, longer sampling times can be selected to conserve battery life or to log data over an extended time period.

To operate the resonance monitor, a user selects the resonance mechanism and the necessary parameters from the storage associated with the monitor, whether by input from a keyboard or other input means. Field measurements are started, and the resonance yield is displayed on the monitor's read-out device.

In developing the present invention, published laboratory studies showed that biological effects from ELF magnetic fields often occurred under conditions obeying the gyromagnetic equations [Blackman, 1990; Liboff et al., 1990]. The inventors then determined parameters in the gyromagnetic equation which resulted in biological changes. If the magnetic resonances can affect biological processes in the laboratory experiments, they proposed that magnetic fields in the environment can affect biological processes such as cancer.

Mathematical equations from electromagnetic field theory and from quantum mechanics were derived for magnetic resonances due to the arbitrary alignment of magnetic fields in the environment. It was then confirmed that the magnetic field characteristics needed to determine resonance conditions could be obtained by electronic analysis of the signals from magnetic field probes, such as the fluxgate magnetometer, the Hall-effect probe and the induction coil.

Using existing instruments with these probes, the inventors had previously measured magnetic field characteristics in a wide variety of residences and workplaces for epidemiological studies of hundreds of subjects [London et al., 1991; Bowman et al., 1992]. However, these earlier epidemiological studies showed that physical characteristics of a magnetic field, as measured by existing instruments, seldom correlated with the risk of cancer. Then, crude measurements of magnetic resonance conditions with existing instrumentation displayed correlation with occurrence of cancer risk.

A prototype device was built for acquiring and analyzing the signal from a single fluxgate magnetometer probe to give the magnitude, frequency and phase spectra for the static and oscillating components of the magnetic field at a single point in space. From this experience with the single-axis prototype, the signals from commercially-available 3D fluxgate magnetometer probes were simulated for residential and workplace environments which had been previously measured with conventional instruments, and the resonance yield was evaluated, using the above described processing system of this invention.

The present invention thus provides a magnetic field monitor, either stationary, personally worn or hand-held, for measuring environmental field conditions which could be in resonance with magnetic moments in the human body. With the selection of appropriate probes, signal analysis, and data storage options as hereinabove described, the family of monitors described herein can accurately evaluate the resonance yield from magnetic fields in residential and workplace environments, either for research studies or for the routine evaluations of health hazards.

In contrast with prior art systems, the invention does not simply measure the physical characteristics of the environmental magnetic field. Instead, the inventive monitor analyzes the magnetic field further to determine the resonance yield predicted from a person's field exposure at the time and place of the measurement. The invention employs a unique type of filter for the oscillating magnetic field, based on the gyromagnetic equation. The invention further determines the relative spatial orientation of the static and oscillating magnetic field vectors needed to determine resonance conditions.

Thus, the described invention operates beyond mere measurements of the physical characteristics of the environmental magnetic fields, to provide direct evaluation of the possibility of magnetic resonances affecting biological chemistry. Many research studies have shown that the simplest physical characteristics of a magnetic field do not always determine the biological effects of the fields. Furthermore, the complete set of physical characteristics of the magnetic field environment is too large to be easily interpreted with respect to possible health effects.

Thus, in contrast to prior art systems, the present invention measures the resonance yield from static and oscillating magnetic fields in the environment. By employing theories of magnetic resonance, the magnetic field's physical characteristics are reduced to the resonance yield, a single number representing the field's capability of altering chemistry and possibly biology through resonances with magnetic moments in the human body.

The present invention thus provides a digital bandpass filter operating according to the gyromagnetic equation, an electronic evaluation of the three magnetic field components parallel and perpendicular to the static magnetic field needed for magnetic resonance analysis, and real-time evaluation of resonance yields in an electronic instrument suitable for occupational and environmental health studies.

The foregoing description of the preferred embodiment of the invention has been presented for purposes of illustration and description. It is not intended to be exhaustive or to limit the invention to the precise forms disclosed, since many modifications or variations thereof are possible in light of the above teaching.

For example, one possible design modification is to store the resonance yield, along with the monitor settings and the time, in a miniature data logger incorporated into the resonance monitor. By this means, the temporal pattern of exposure to the resonance conditions could be downloaded onto computer for storage, permitting subsequent graphical display and mathematical analysis. A further possible design modification is to output the signals from the AC and DC probes and the clock onto an eight-track Digital Audio Tape (DAT) or other storage medium, creating a comprehensive record of the magnetic field environment over time. All such modifications and variations are within the scope of the invention. The embodiments described herein were chosen and described in order best to explain the principles of the invention and its practical application, thereby to enable others skilled in the art to utilize the invention in various embodiments and with various modifications as are suited to the particular use contemplated therefor. It is intended that the scope of the invention be defined by the claims appended hereto, when interpreted in accordance with the full breadth to which they are legally and equitably entitled.

What is claimed is:

1. Measuring device for measuring magnetic resonance between magnetic moments in an object and a multi-dimensional magnetic field including static and oscillating components, comprising:

probe means for detecting static and oscillating components of a magnetic field and for outputting first and second signals respectively representative thereof;

resultant generating means receiving said first signals for generating and outputting a resultant signal representative of a resultant magnitude of the static component of said magnetic field;

filter means responsive to said resultant signal for establishing a central frequency for filtering said second signals representative of said oscillating component of said magnetic field and for outputting filtered signals representative of the oscillating component of the magnetic field;

phase analyzing means receiving said filtered signals for outputting phase signals and magnitude signals respectively indicative of phases and magnitudes of the oscillating component of the magnetic field; and yield determining means receiving said phase signals, said magnitude signals, and said first signals for determining a resonance yield of said magnetic field, thereby identifying a change in a rate of chemical reactions involving resonances between the magnetic moments in the object and the multi-dimensional magnetic field.

2. The measuring device recited in claim 1, wherein said multi-dimensional magnetic field is a three dimensional magnetic field, and said yield determining means operates for identifying a change in a rate of chemical reaction involving resonance between the magnetic moments in the object and said three dimensional magnetic field.

3. The measuring device recited in claim 2, wherein said yield determining means comprises spatial analyzing means receiving said phase signals, said magnitude signals, and said first signals for determining a parallel component of the oscillating component of said magnetic field parallel to a static field vector representing said static component thereof, for determining first and second perpendicular components representative of circularly polarized fields rotating in a plane perpendicular to the static field vector, said first and second circularly polarized fields having helicities opposite to each other, and for outputting a parallel signal representative of said parallel component, a first helicity signal indicative of said first perpendicular component, and a second helicity signal representative of said second perpendicular component.

4. The measuring device recited in claim 3, further comprising resonance analyzing means for computing a resonance yield for the magnetic field and the object, said resonance analyzing means including storage for storing a formula identifying resonance yield for the object in response to at least one of the parallel signal and said first and second helicity signals.

5. The measuring device recited in claim 2, wherein said yield determining means comprises:

spatial analyzing means receiving said phase signals, said magnitude signals, and said first signals for determining a spatial orientation of the static and oscillating components of the magnetic field therefrom and for outputting: a parallel signal indicative of a component of the oscillating component of the magnetic field parallel to the static component of the magnetic field; and helicity signals indicative of components of the oscillating component of the magnetic field perpendicular to the static magnetic field, and resonance analyzing means receiving said resultant signal, said parallel signal and said helicity signals from said spatial analyzing means for determining said resonance yield of said magnetic field and outputting a signal indicative thereof.

6. The measuring device recited in claim 5, wherein said filter means operates for implementing a gyromagnetic equation to establish said center frequency thereof.

7. The measuring device recited in claim 5, wherein said filter means has a variable bandwidth, and further including storage means for storing a bandwidth parameter to control the bandwidth of said filter means in accordance with data for the object.

8. The measuring device recited in claim 1, wherein said yield determining means comprises programmed spatial analyzing means for determining a parallel component of the oscillating component of said magnetic field parallel to a static field vector representing the static component of said magnetic field, and for determining first and second vectors representative of first and second circularly polarized fields rotating in a plane perpendicular to the static field vector, said first and second circularly polarized fields being of opposite helicity to each other.

9. The measuring device recited in claim 8, further comprising programmed resonance analyzing means for computing a resonance yield for the magnetic field and the object, said resonance analyzing means including storage for storing a formula identifying resonance yield for the object in accordance with at least one of the parallel component and said circularly polarized components of the magnetic fields.

10. In a measuring device for measuring magnetic fields including probe means for detecting static and oscillating components of a magnetic field and for outputting first and second signals respectively representative thereof, the improvement comprising:

resonance means for measuring resonance between magnetic moments in an object and a three-dimensional magnetic field having three spatial static components and three spatial oscillating components, including:

filter means for filtering said second signals, said filter means having variable center frequency and variable bandwidth and said filter means having a control input receiving a signal for controlling said center frequency thereof and for outputting filtered signals representative of the oscillating component of the magnetic field; and spatial analyzing means for analyzing said filtered signals and said first signals for the three spatial components of the oscillating magnetic field and for outputting signals representing a parallel magnitude of an oscillating component oscillating parallel to a resultant static magnetic field vector of the magnetic field and circular magnitudes of two circularly-polarized components of the oscillating magnetic field rotating with helicities opposite to each other; and resonance analyzing means for analyzing said signals representing parallel and circular magnitudes of said spatial components of the oscillating magnetic field and said first signal to identify a resonance yield of said magnetic field and for providing a yield signal indicative thereof.

11. A measuring device as recited in claim 10, further comprising analog to digital converting means for converting said first and second signals to digital form, resultant calculating circuit receiving said first signals in digital form from said analog to digital converting means and outputting signals indicative of directional components of the static component of the magnetic field and a resultant signal indicative of a resultant magnitude of the resultant static magnetic field vector, said filter means connected for receiving said second signals in digital form from said analog to digital converting means and for receiving said resultant signal from said resultant calculating circuit at said control input, said filter means responsive to said resultant signal for controlling a center frequency for filtering said second signals according to the gyromagnetic equation.

12. A measuring device as recited in claim 11, further comprising phase analyzing means receiving said filtered signals from said filter means and for performing a phase analysis thereon;

said phase analyzing means outputting phase signals indicative of phases of three directional components of said filtered signals and magnitude signals indicative of magnitudes of the three directional components of said filtered signals relative to said directional components of the static component of the magnetic field outputted by said resultant calculating circuit, said spatial analyzing means receiving said phase signals and said magnitude signals from said phase analyzing means for generating said signals representing said parallel and circular magnitudes of said oscillating magnetic field.

13. A measuring device as recited in claim 12, further comprising output means for displaying said yield signal.

14. A measuring device as recited in claim 12, further comprising storage means for storing said yield signal.

15. A measuring device as recited in claim 12, further comprising data logging means for storing said yield signal as a function of time.

16. Measuring device for measuring magnetic resonance between magnetic moments in an object and a multi-dimensional magnetic field including static and oscillating components, comprising:

probe means for detecting static and oscillating components of a magnetic field and for outputting first and second signals respectively representative thereof;

resultant generating means receiving said first signals for generating and outputting a resultant signal representative of a resultant magnitude of the static component of said magnetic field;

filter means responsive to said resultant signal for establishing a central frequency for filtering said second signals representative of said oscillating component of said magnetic field and for outputting filtered signals representative of the oscillating component of the magnetic field;

phase analyzing means receiving said filtered signals for outputting phase signals and magnitude signals respectively indicative of phases and magnitudes of the oscillating component of the magnetic field;

yield determining means receiving said phase signals, said magnitude signals, and said first signals for determining a spatial orientation of the static and oscillating components of the magnetic field and for determining a resonance yield of said magnetic field, thereby identifying a change in a rate of chemical reactions involving resonances between the magnetic moments in the object and the multi-dimensional magnetic field, said yield determining means further operating for outputting: a parallel signal indicative of a component of the oscillating component of the magnetic field parallel to the static component of the magnetic field; and helicity signals indicative of components of the oscillating component of the magnetic field perpendicular to the static magnetic field.

* * * * *